United States Patent
Tsurushima

[11] 3,968,382
[45] July 6, 1976

[54] PROTECTIVE CIRCUIT FOR FIELD EFFECT TRANSISTOR AMPLIFIER

[75] Inventor: Katsuaki Tsurushima, Kawasaki, Japan

[73] Assignee: Sony Corporation, Tokyo, Japan

[22] Filed: Oct. 4, 1974

[21] Appl. No.: 512,257

[30] Foreign Application Priority Data
Oct. 16, 1973 Japan.............................. 48-120204

[52] U.S. Cl........................... 307/202 R; 307/304;
317/33 R; 330/15; 330/17; 330/22; 330/35;
330/207 P
[51] Int. Cl.²...................... H02H 9/04; H02H 7/20;
H03F 3/16; H03F 3/185
[58] Field of Search............. 307/202, 304; 330/15,
330/17, 22, 35, 207 P; 317/33 R, 33 SC

[56] References Cited
UNITED STATES PATENTS

| | | | |
|---|---|---|---|
| 3,359,503 | 12/1967 | Warner, Jr............................ | 330/17 |
| 3,435,257 | 3/1969 | Lawrie, Jr............................ | 307/289 |
| 3,441,864 | 4/1969 | Hafler............................. | 330/207 P |
| 3,469,203 | 9/1969 | Poitras.............................. | 330/15 X |
| 3,508,162 | 4/1970 | Eisenberg....................... | 307/202 X |
| 3,512,100 | 5/1970 | Killion................................. | 330/35 |
| 3,536,958 | 10/1970 | Sondermeyer.................... | 330/207 P |
| 3,569,849 | 3/1971 | Cassidy et al..................... | 330/17 X |
| 3,668,545 | 6/1972 | Recklinghausen............... | 330/207 P |
| 3,681,659 | 8/1972 | Suzuki............................. | 307/202 X |
| 3,801,858 | 4/1974 | Grangaard et al................ | 330/17 X |

*Primary Examiner*—John S. Heyman
*Assistant Examiner*—L. N. Anagnos
*Attorney, Agent, or Firm*—Lewis H. Eslinger; Alvin Sinderbrand

[57] ABSTRACT

A field effect transistor amplifier comprising one or more depletion-type field effect transistors, preferably with triode characteristics, and having an operating voltage applied across its drain and source electrodes through a load, while an input signal to be amplified is applied to its gate electrode and a predetermined DC gate bias voltage is applied between the gate and source electrodes; is provided with a protective circuit for preventing damage to the field effect transistor by an excessive input signal that is, by over-drive, and which includes a source resistor connected in series with the source electrode and a constant voltage element, for example, constituted by one or more diodes, connected between the gate electrode and the side of the source resistor remote from the respective source electrode. The resistance value of the source resistor and the forward voltage of the diode or constant voltage element are selected so that the maximum drain or source current of each field effect transistor, when operated with an input signal applied to its gate electrode, does not exceed the maximum drain or source current of the field effect transistor in the absence of any gate-source voltage applied thereto. The source resistor of the foregoing protective circuit may further preferably be included in another protective circuit by which the input signal is shunted to the load when the impedance of the latter declines below a predetermined value, for example, in response to a short circuit in the load, so as to prevent overloading of the field effect transistor. Further, a push-pull amplifier employing triode characteristic field effect transistors with the foregoing protective circuits therefor is disclosed with a biasing circuit for stabilizing the biasing DC drain current of the field effect transistors when the operating voltage is subject to fluctuations.

10 Claims, 8 Drawing Figures

PROTECTIVE CIRCUIT FOR FIELD EFFECT TRANSISTOR AMPLIFIER

BACKGROUND OF THE INVENTION

1. Field of the Invention

This invention relates generally to a protective circuit for a field effect transistor amplifier, and more particularly is directed to a protective circuit for preventing damage to the amplifying field effect transistor or transistors by an abrupt increase in the applied input signal to an excessive value.

2. Description of the Prior Art

Many protective circuits have been proposed for use with transistor amplifiers employing bipolar transistors. However, few protective circuits are concerned with field effect transistor amplifiers in which a field effect transistor is used as a power amplifier, because the usual field effect transistor with pentode characteristics is not suited for operation as a power amplifier.

Recently, field effect transistors with triode characteristics have been developed which are effective for use in a power amplifier because of the relatively higher current and breakdown voltage ratings thereof. Therefore, it has become necessary to provide a new protective circuit for amplifiers employing one or more triode characteristic field effect transistors for amplifying purposes.

In general, a field effect transistor has different characteristics than a bipolar transistor, particularly in that a maximum drain current flows in response to an input signal in the absence of any DC biasing voltage applied between the gate and source electrodes of the field effect transistor. By reason of the foregoing, a protective circuit provided for a bipolar transistor cannot be used for a field effect transistor amplifier, particularly when the field effect transistors of the latter have triode characteristics.

SUMMARY OF THE INVENTION

Accordingly, it is an object of the present invention to provide an improved protective circuit for a field effect transistor amplifier, and which is particularly adapted to prevent damage to one or more amplifying field effect transistors by overdrive, that is, when the input signal therefor abruptly rises to an excessive value.

Another object is to provide a protective circuit, as aforesaid, for a field effect transistor amplifier which is effective for use as an audio power amplifier.

Still another object is to provide a protective circuit, as aforesaid, for a field effect transistor amplifier which is of the push-pull type.

A further object is to provide a protective circuit, as aforesaid, for a transistor amplifier in which one or more depletion-type field effect transistors with triode characteristics are used for amplifying purposes.

A still further object is to provide a field effect transistor amplifier, preferably employing depletion-type field effect transistors with triode characteristics for amplifying purposes, with protective circuits for preventing damage to such transistors by overdrive, that is, by an excessive input signal, as aforesaid, and for preventing damage by overloading, for example, when the load impedance drops precipitously, as in response to a short circuit in the load, and further to provide such an amplifier with a biasing circuit by which the biasing DC drain current for each amplifying field effect transistor is stabilized notwithstanding the occurrence of fluctuation in the operating voltage therefor.

In accordance with an aspect of this invention, a field effect transistor amplifier comprising one or more depletion-type field effect transistors, preferably with triode characteristics, and having an operating voltage applied across the drain and source electrodes of each such transistor through a load, while an input signal to be amplified is applied to the gate electrode and a predetermined DC gate bias voltage is applied between the gate and source electrodes; is provided with a source resistor connected in series with the source electrode of each field effect transistor and a constant voltage element, such as, one or more diodes, connected between the gate electrode of each field effect transistor and the side of the respective source resistor remote from the source electrode. The resistance value of each source resistor and the forward voltage of the associated diode or other constant voltage element are selected so that the maximum drain or source current of each field effect transistor, when operated with an input signal applied to its gate electrode, cannot exceed the maximum drain or source current which occurs in the absence of any gate-source voltage, whereby to protect each field effect transistor from damage by an abruptly excessive input signal, that is, by overdrive.

It is a feature of the above protective circuit according to this invention that each of the mentioned source resistors may be included in a detecting circuit for detecting the impedance of the associated load and for operating a shunting or switching circuit by which the input signal is shunted directly to the load when the detected load impedance undergoes a precipitous decline, as in response to a short circuit, whereby to protect each field effect transistor from damage by overloading.

The above and other objects, features and advantages of the invention, will be apparent in the following detailed description of an illustrative embodiment which is to be read in connection with the accompanying drawings.

DESCRIPTION OF THE PREFERRED EMBODIMENT

A depletion-type field effect transistor with triode characteristics that is suitable for use in a field effect transistor amplifier having a protective circuit according to the present invention will first be described with reference to FIG. 1.

Figure 1:
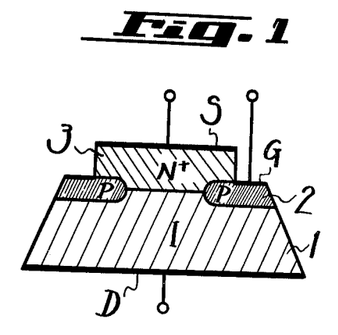
FIG. 1 is a sectional view showing an example of a field effect transistor with triode characteristics that may be used in a transistor amplifier having a protective circuit according to the present invention.

As shown on FIG. 1, a field effect transistor with triode characteristics may include an intrinsic semiconductor region 1 of low impurity concentration and high resistance which has thereon an annular P-type semiconductor region 2 formed by a selective diffusion method or the like. An N-type semiconductor region 3 of high impurity concentration spreading over the intrinsic semiconductor region 1 and the P-type semiconductor region 2 is formed by an epitaxial method or the like. A drain electrode D is provided at the bottom of intrinsic semiconductor region 1, a gate electrode G is provided on P-type semiconductor region 2, and a source electrode S is provided on the upper surface of N-type semiconductor region 3.

Figure 2:
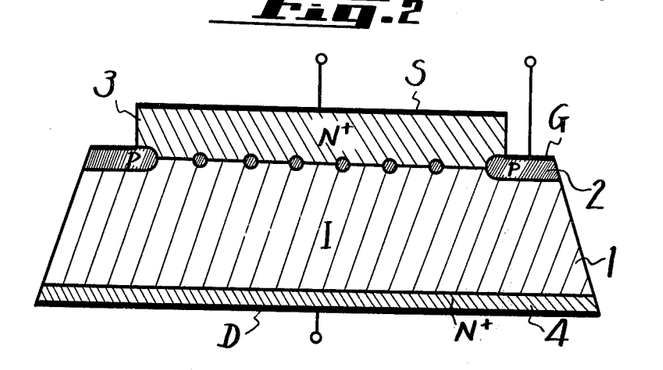
FIG. 2 is a sectional view showing another example of a field effect transistor with triode characteristics that may be used in a transistor amplifier having a protective circuit according to the present invention.

Referring now to FIG. 2, in which elements corresponding to those described above with reference to FIG. 1 are identified by the same reference numerals, it will be seen that, in a preferred type of field effect transistor with triode characteristics suitable for use in transistor amplifiers having a protective circuit according to this invention, the P-type semiconductor region 2 is formed in a mesh-like configuration, and an N-type semiconductor region 4 of high impurity concentration is provided under the lower surface of the intrinsic semiconductor region for increasing the breakdown voltage between the drain and source electrodes D and S.

In the field effect transistors of FIGS. 1 and 2, increasing the gate voltage (negatively) causes growth of depletion layers from the portions of gate region 2 that extend between regions 1 and 3 and the channel is formed in region 3 between such gate portions. Since region 3 is shown to be of N-type conductivity, the field effect transistors illustrated on FIGS. 1 and 2 are N-channel transistors, however, it will be apparent that similar field effect transistors may be provided with the regions 2 and 3 thereof being of N-type and P-type conductivities, respectively, so as to be P-channel field effect transistors.

In any case, it will be apparent that each of the illustrated field effect transistors has a vertical channel, rather than a lateral channel as in a conventional field effect transistor. By reason of such vertical channel, both the distance between the source electrode S and the channel and the length of the channel itself are very small so that the field effect transistor has a very low output resistance or impedance, for example, on the order of about 10 ohms, which is not varied in response to voltage fluctuations. It is a feature of field effect transistors of the type shown on FIGS. 1 and 2 that the drain current thereof does not become saturated in response to increasing of the voltage between the drain and source. As shown on FIG. 3 by way of example, in which the abscissa indicates drain voltage $V_D$ in volts (V) and the ordinate indicates drain current $I_D$ in milliampere (mA), with gate voltage $V_G$ in volts (V) being used as a parameter, the drain voltage-drain current characteristic curves of a field effect transistor with a vertical channel, such as is shown on FIGS. 1 and 2, are similar to those of a triode so that the illustrated field effect transistors can be said to have triode characteristics. More particularly, it will be seen that the drain voltage-drain current characteristic curves of FIG. 3, being similar to those of a triode, are straight for substantial portions of their lengths with such straight portions being steeply inclined and substantially parallel, to indicate a low output impedance which is substantially not varied with voltage fluctuations and the capacity to provide a large output of excellent linearity and relatively low distortion.

As distinguished from the foregoing, in a conventional junction type field effect transistor having a lateral channel, the resistance between the source electrode and the channel, the resistance of the channel itself and the resistance between the channel and the drain electrode are all large with the result that the output resistance or impedance of the confentional field effect transistor is very high, for example, on the order of several meg-ohms, so as to exhibit so-called pentode characteristics. Accordingly, with the conventional field effect transistors having pentode characteristics, as the voltage applied to its drain electrode increases, the drain voltage-drain current characteristics of such transistor tend to cause saturation of the drain current at a predetermined value of the drain voltage.

Figure 3:
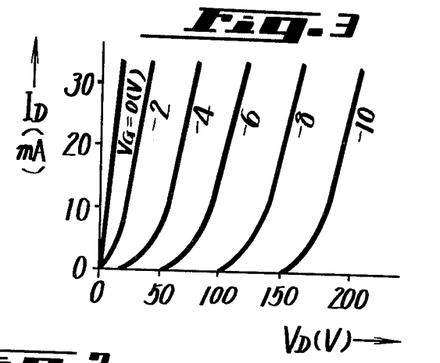
FIG. 3 is a graph illustrating typical output characteristics of a field effect transistor of the types shown in FIG. 1 and FIG. 2.
Figure 4:
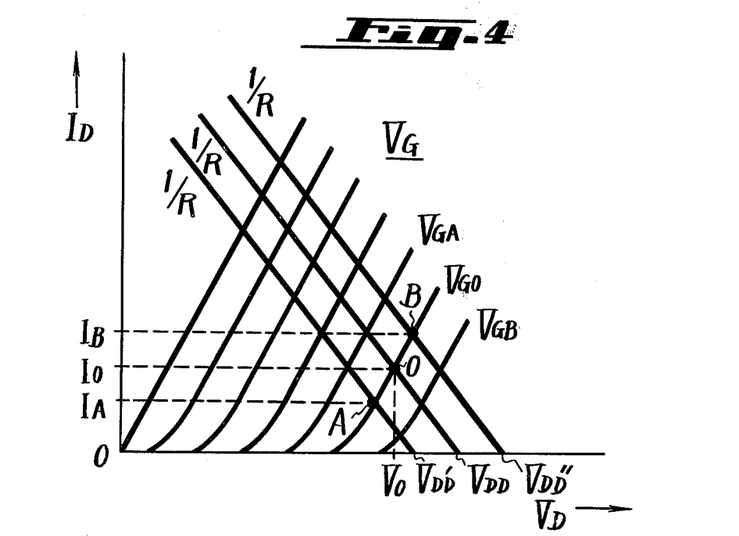
FIGS. 4 and 5 are graphs to which reference will be made in explaining the characteristics of amplifiers to which the present invention relates.

Referring now to FIG. 4, in which the abscissa indicates drain voltage $V_D$, the ordinate indicates drain current $I_D$, and the gate voltage $V_G$ is again used as a parameter, as in FIG. 3, it will be seen that the drain voltage-drain current characteristic curves for a field effect transistor with triode characteristics, when used as the amplifying element in an amplifier, are similar to those shown on FIG. 3. If the gate voltage $V_G$ is assumed to be $V_{GO}$, and a load line having a gradient $1/R$ is drawn from a base or normal voltage $V_{DD}$ applied to the drain from a suitable source so as to intersect the drain voltage-drain current curve for the gate voltage $V_{GO}$ at the point O, such point O can be considered the normal operating point corresponding to a drain DC biasing current $I_o$. However, if the voltage applied from the voltage source to the drain fluctuates from the base or normal value $V_{DD}$, for example, to the relatively lower value $V'_{DD}$ or the higher value $V''_{DD}$, the load line having the gradient $1/R$ shifts, as shown, to have the base point $V'_{DD}$ or $V''_{DD}$, respectively, and to intersect the characteristic curve for the gate voltage $V_{GO}$ at the point A or B, whereby the drain DC biasing current changes to the value $I_A$ or $I_B$, respectively. The foregoing characteristic of field effect transistors with triode characteristics is obviously disadvantageous in an audio output amplifier in that it introduces distortions in the amplified output in response to fluctuations in the operating voltage source.

Figure 5:
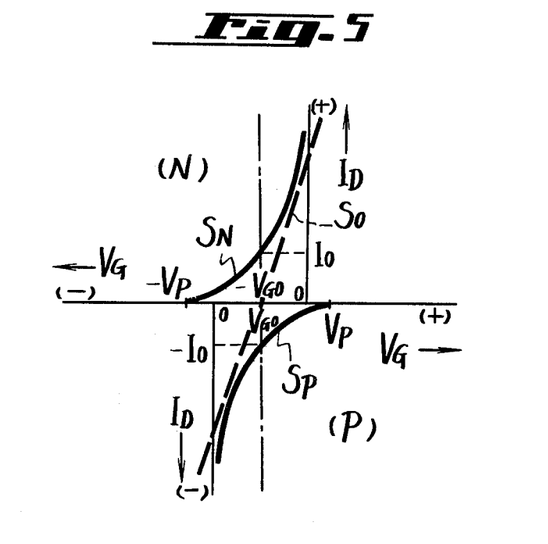

The above disadvantage of field effect transistors with triode characteristics is accentuated when such N-channel and P-channel transistors are employed in an audio output amplifier of the pure complementary push-pull type or AB-class. In that case, the N-channel and P-channel transistors with triode characteristics are selected to have gate voltage-drain current curves with remote cut-off characteristics. For example, as shown on FIG. 5, the N-channel and P-channel transistors for use in such an audio output amplifier may have the gate voltage ($V_G$)-drain current ($I_D$) curves shown in full lines at $S_N$ and $S_P$, respectively. When the gate voltages applied to the N-channel and P-channel transistors have the values $-V_{GO}$ and $V_{GO}$, respectively, the composite characteristic curve is, for example, as indicated in broken lines at $S_0$ on FIG. 5. However, when the DC biasing drain current of each of the transistors is lowered from $I_0$ to $I_A$ due to fluctuation of the voltages applied to the drains from the voltage source, as described above with reference to FIG. 4, a step is formed in the composite characteristic curve $S_0$ at the point of zero drain current, with the result that a crossover distortion is introduced.

It has been proposed to avoid the foregoing problem in AB-class push-pull amplifiers, as well as in any other type of amplifier employing one or more triode characteristic field effect transistors for amplifying purposes, by suitably varying a DC bias voltage applied between the gate and source electrodes of each such transistor in response to variations or fluctuations in the drain voltage, that is, the operating voltage for the transistor, whereby to maintain constant the DC biasing drain current in spite of such fluctuations. For example, as shown on FIG. 4, if the operating voltage fluctuates from its normal value $V_{DD}$ to a reduced value $V'_{DD}$ so as to vary the drain current from $I_0$ to $I_A$, the drain current is restored to its value $I_0$ by reducing the gate voltage from the value $V_{G0}$ to the value $V_{GA}$ which corresponds to the drain voltage-drain current curve intersected at the drain current value $I_0$ by the load line extending from the voltage $V'_{DD}$. Conversely, as also shown on FIG. 4, if the operating voltage fluctuates from its normal value $V_{DD}$ to an increased value $V''_{DD}$ so as to change the drain current from $I_0$ to $I_B$, the drain current is restored to its value $I_0$ by increasing the gate voltage from the value $V_{G0}$ to the value $V_{GB}$ which corresponds to the drain voltage-drain current curve intersected at the drain current value $I_0$ by the load line extending from the voltage $V''_{DD}$.

Figure 6:
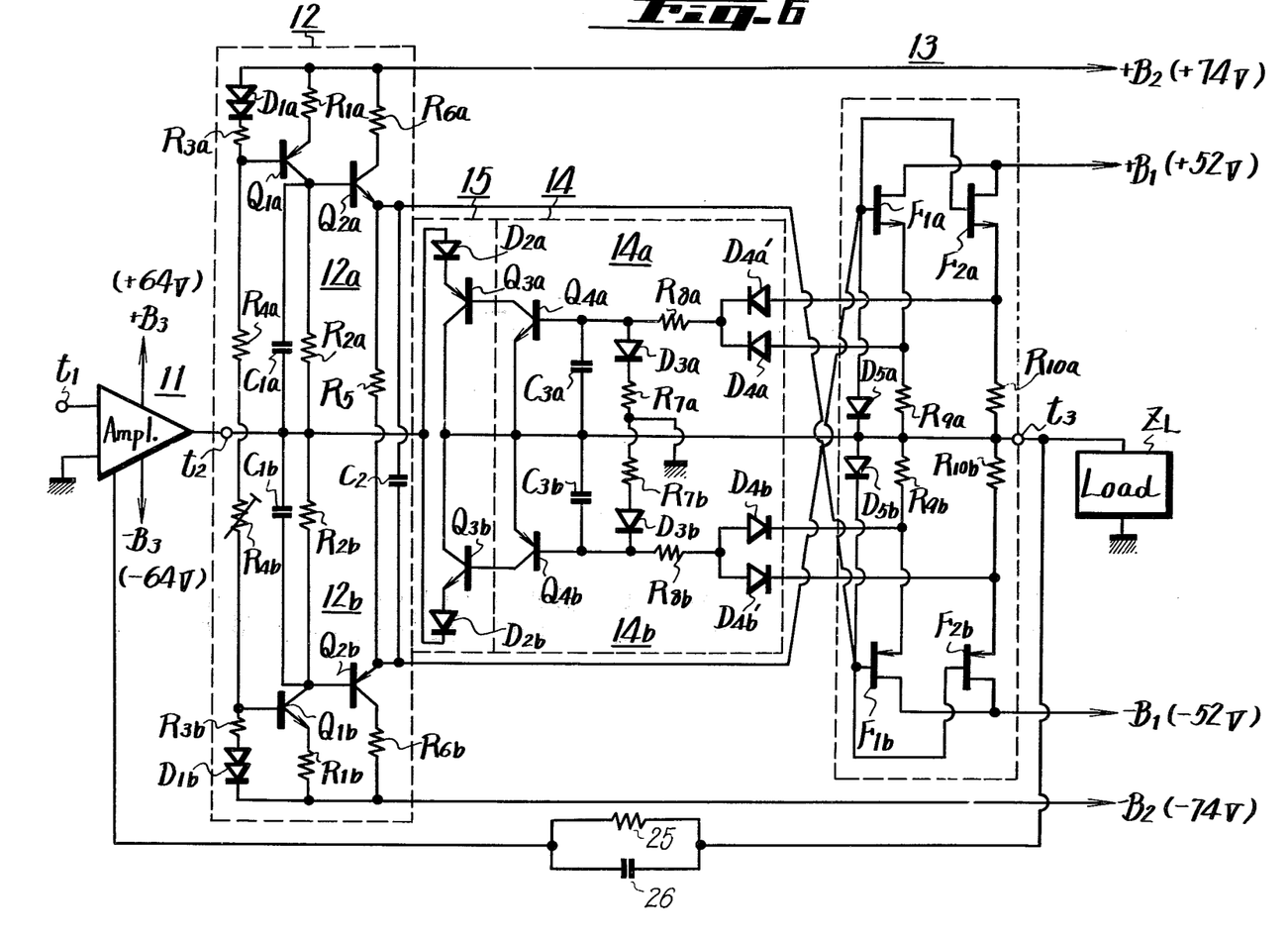
FIG. 6 is a circuit diagram showing a field effect transistor amplifier having a protective circuit according to an embodiment of the present invention.

Referring now to FIG. 6, it will be seen that an amplifier of the type to which this invention is preferably applied may generally comprise a driving stage 11, for example, in the form of a conventional A-class amplifier, having an input terminal $t_1$ and an output terminal $t_2$, a pure complementary push-pull output stage 13 employing depltion-type field effect transistors with triode characteristics for amplifying purposes, and a biasing circuit 12 which is effective to reverse-bias the gate-source junctions of the depletion-type field effect transistors and which is arranged to compensate for fluctuations in the operating voltage applied from a suitable voltage source to the triode characteristic field effect transistors in output stage 13.

A negative feedback signal may be supplied from the output of output stage 13 to the amplifier constituting driving stage 11 by way of a parallel circuit of a resistor 25 and capacitor 26, as shown. Further, a resistor (not shown) may be connected between output terminal $t_2$ of driving stage 11 and ground to establish a reference potential of biasing circuit 12. The driving stage 11 is operated by suitable voltages applied thereto from voltage source terminals $+B_3$ and $-B_3$. It will be apparent that an input signal applied to input terminal $t_1$ of the A-class amplifier constituting driving stage 11 is amplified by the latter to provide an output signal at terminal $t_2$ having a sufficient gain for driving the push-pull output stage 13.

The illustrated pure complementary push-pull output stage 13 is shown to generally include a pair of N-channel field effect transistors with triode characteristics, as indicated at $F_{1a}$ and $F_{2a}$, and a pair of P-channel field effect transistors with triode characteristics, as indicated at $F_{1b}$ and $F_{2b}$, with parallel push-pull connections between such transistors. More specifically, as shown, the drain electrodes of N-channel transistors $F_{1a}$ and $F_{2a}$ are connected to a terminal $+B_1$ of a voltage source whose other terminal is constituted by the ground, while the source electrodes of transistors $F_{1a}$ and $F_{2a}$ are connected to an output terminal $t_3$ of output stage 13 and thence through a load $Z_L$, which may be constituted by a speaker, to the ground. The P-channel transistors $F_{1b}$ and $F_{2b}$ have their drain electrodes connected to a terminal $-B_1$ of a voltage source whose other terminal is again constituted by ground, and the source electrodes of transistors $F_{1b}$ and $F_{2b}$ are connected to output terminal $t_3$ and thence through load $Z_L$ to the ground.

The biasing circuit 12 is shown to be composed of a first biasing circuit 12a supplying a biasing voltage for reverse-biasing the gate-source junctions of transistors $F_{1b}$ and $F_{2b}$, and a second biasing circuit 12b supplying a biasing voltage for reverse-biasing the gate-source junctions of transistors $F_{1a}$ and $F_{2a}$, with such biasing voltages being similar to the pinch-off voltages of the respective transistors. The biasing circuits 12a and 12b form constant current circuits, and further function to compensate for fluctuations in the voltages applied from the voltage source terminals $+B_1$ and $-B_1$ to the drain electrodes of the transistors $F_{1a}$ and $F_{2a}$ and of the transistors $F_{1b}$ and $F_{2b}$, respectively.

As shown on FIG. 6, the biasing circuit 12a includes a PNP-type bipolar transistor $Q_{1a}$ having its emitter electrode connected through a resistor $R_{1a}$ to a voltage source terminal $+B_2$, while the collector electrode of transistor $Q_{1a}$ is connected through a parallel connection of a resistor $R_{2a}$ and a capacitor $C_{1a}$ to output terminal $t_2$ of the driving stage 11. The base electrode of transistor $Q_{1a}$ is connected through a series circuit of a resistor $R_{4a}$ and a variable resistor $R_{4b}$ to the base electrode of an NPN-type bipolar transistor $Q_{1b}$ which is included in the second biasing circuit 12b. The base electrode of transistor $Q_{1a}$ is also connected through a resistor $R_{3a}$ to the cathode of a diode $D_{1a}$ which has its anode connected to voltage source terminal $+B_2$. The variable resistor $R_{4b}$ is adjustable to relatively vary the gate biasing voltages of transistors $F_{1a}$ and $F_{1b}$ and of transistors $F_{2a}$ and $F_{2b}$. Biasing circuit 12a is further shown to include an NPN-type bipolar transistor $Q_{2a}$ for impedance conversion which has its base electrode connected to the collector electrode of transistor $Q_{1a}$. The collector electrode of transistor $Q_{2a}$ is connected to voltage source terminal $+B_2$ through a resistor $R_{6a}$, and the emitter electrode of transistor $Q_{2a}$ is connected to the gate electrodes of transistors $F_{1b}$ and $F_{2b}$. Further, the emitter electrode of transistor $Q_{2a}$ is connected through a parallel connection of a resistor $R_5$ and a capacitor $C_2$ to the emitter electrode of PNP-type bipolar transistor $Q_{2b}$ which is also included in the second biasing circuit 12b.

In the second biasing circuit 12b, the NPN-type transistor $Q_{1b}$ has its emitter electrode connected through a resistor $R_{1b}$ to a voltage source terminal $-B_2$, while its collector electrode is connected to the base electrode of the transistor $Q_{2b}$ and also through a parallel connection of a resistor $R_{2b}$ and a capacitor $C_{1b}$ to the output terminal $t_2$ of driving stage 11. The base electrode of transistor $Q_{1b}$ is connected through a resistor $R_{3b}$ to the anode of a diode $D_{1b}$, while the cathode of such diode is connected to the voltage source terminal $-B_2$. Further, the PNP-type transistor $Q_{2b}$ for impedance conversion or amplification has its collector electrode connected through a resistor $R_{6b}$ to the voltage source terminal $-B_2$, and its emitter electrode is connected to the gate electrodes of transistors $F_{1a}$ and $F_{2a}$.

In the amplifier illustrated on FIG. 6, the voltage source terminals $+B_3$ and $-B_3$ may respectively provide $+64V$. DC and $-64V$. DC which, as described above, are applied to driving stage 11 as the operating voltages for the latter, and which are required to be constant or stabilized.

The voltage source terminals $+B_1$, $+B_2$, $-B_1$ and $-B_2$ may provide nominal DC voltages of $+52V$., $+75V$., $-52V$. and $-74V$., respectively, which are not stabilized so that considerable ripple components may appear therein in response to variations in the load current. However, the voltage source terminals $+B_1$, $+B_2$, $-B_1$ and $-B_2$ are provided on a common voltage source circuit (not shown) so that equal voltage fluctuations will normally occur simultaneously at such voltage source terminals. In other words, an increase in the positive voltage at terminal $+B_1$ from its nominal value of $+52V$., for example, will be accompanied by an equal increase, in the positive direction, in the voltage at terminal $+B_2$ and by equal increases, in the negative direction, in the voltages at terminals $-B_1$ and $-B_2$.

With the above described arrangement in biasing circuit 12, the biasing circuits 12a and 12b are symmetrical with respect to output terminal $t_2$ of driving stage 11, and the input signal voltages applied to the collector electrodes of transistors $Q_{1a}$ and $Q_{1b}$ are varied in phase with each other, so that the output terminal $t_2$ may be regarded as being grounded from a biasing DC voltage point of view. With the foregoing in mind, and assuming that, in the biasing circuit 12a, the values of resistors $R_{1a}$, $R_{2a}$, $R_{3a}$ and $R_{4a}$ of biasing circuit 12a respectively are $r_1$, $r_2$, $r_3$ and $r'4$, the voltage of voltage source terminal $+B_2$ is $E_{GG}$, the base-emitter voltage of transistor $Q_{1a}$ is $V_{BE}$, and the forward voltage of diode $D_{1a}$ is $V_d$ and the ratio $r_2/r_1$ is K, then the DC voltage $E_o$ obtained at the collector electrode of transistor $Q_{1a}$ may be expressed as follows:

$$E_o = \left[ V_d + \frac{r_3}{r_3 + r_4}(E_{GG} - V_d) - V_{BE} \right] K \quad (1)$$

If equation (1) is partially differentiated by $E_{GG}$, the following equation is obtained:

$$\frac{\delta E_o}{\delta E_{GG}} = K \cdot \frac{r_3}{r_3 + r_4} \quad (2)$$

Further, if the amplification constant of each of the transistors $F_{1b}$ and $F_{2a}$ is $\mu$, the following equation is established as inherent in the triode characteristics of such transistors:

$$\frac{\delta E_o}{\delta E_{GG}} = \frac{1}{\mu} \quad (3)$$

By substituting equation (3) in equation (2), the following equation is obtained:

$$\mu K \cdot \frac{r_3}{r_3 + r_4} = 1 \quad (4)$$

If the values K, $r_3$ and $r_4$ are selected so as to satisfy equations (1) and (4), the DC biasing drain current $I_{do}$ of transistors $F_{1b}$ and $F_{2b}$ can be made constant independent of voltage fluctuations at the voltage source terminal $-B_1$.

If, as in a practical example $E_o=21V$., $E_{GG}=74V$., $V_d=1.3V$., $V_{BE}=0.6V$. and $\mu=8.1$, the substitution of the foregoing values in equation (1) and also the substitution of $1/\mu$ K for $$\frac{(r_3)}{r_3 + r_4}$$

(from equation 4), makes it possible to solve simply for $K=17.2$, that is, $r_2/r_1=17.2$. Further, by substituting $\mu=8.1$ and $K=17.2$ in equation (4), $r_4/r_3=138$ is obtained. Therefore, in this example, if the values $r_1$ and $r_3$ for resistors $R_{1a}$ and $R_{3a}$ are selected to be 820 ohms and 270 ohms, respectively, then the values $r_2$ and $r_4$ for resistors $R_{2a}$ and $R_{4a}$ have to be approximately 14K. ohms and 37K. ohms, respectively, to provide the desired stabilization of the DC biasing drain current of transistors $F_{1b}$ and $F_{2b}$ in the face of fluctuations in their operating voltage at terminal $-B_1$.

Since the second biasing circuit 12b is constructed symmetrically with respect to biasing circuit 12a, the circuit constants of circuit 12b can be selected to be similar to those described above with reference to circuit 12a, whereby to provide the desired stabilization of the DC biasing drain current of transistors $F_{1a}$ and $F_{2a}$ in the face of fluctuations in their operating voltage at terminal $+B_1$.

It will be apparent that the transistors $Q_{2a}$ and $Q_{2b}$, which are provided for impedance conversion, may be theoretically omitted from the biasing circuits 12a and 12b without affecting the operation of the latter in stabilizing the DC biasing drain currents of the triode-characteristic field effect transistors in output stage 13. Further, although the output stage 13 is shown to include a pair of triode-characteristic field effective transistors $F_{1a}$ and $F_{2a}$ connected in parallel with each other and in push-pull relation to the other pair of parallel connected triode-characteristic field effect transistors $F_{1b}$ and $F_{2b}$, the present invention may be applied to an amplifier with an output stage having additional triode-characteristic field effect transistors connected in parallel with transistors $F_{1a}$ and $F_{2a}$ and with transistors $F_{1b}$ and $F_{2b}$, respectively, or with an output stage having only the transistors $F_{1a}$ and $F_{1b}$ in push-pull relationship. Further, the present invention can be applied to an amplifier having only a single triode-characteristic field effect transistor, for example, the transistor $F_{1a}$, preferably in association with a suitable biasing circuit, such as the biasing circuit 12b.

In the amplifier of FIG. 6, when the voltage source circuit is switched on, the predetermined gate biasing voltages may not be applied to the triode-characteristic field effect transistors $F_{1a}$, $F_{2a}$, $F_{1b}$ and $F_{2b}$ from the biasing circuits 12a and 12b as rapidly as the full drain biasing voltages are applied to the field effect transistors from the voltage source terminals $+B_1$ and $-B_1$. Thus, even an input signal which is not excessive, if applied to the gate electrode of the field effect transistor $F_{1a}$, $F_{2a}$, $F_{1b}$ or $F_{2b}$ at a time when the predetermined DC gate biasing voltage has not yet been applied thereto, can upset the desired reverse-biasing condition at gate-source junction of the transistor and thereby cause excessive or damaging currents to flow through the field effect transistor. Similarly, even when the full or predetermined DC gate biasing voltage is applied to each of the field effect transistors $F_{1a}$, $F_{2a}$, $F_{1b}$ and $F_{2b}$ from the biasing circuits 12a and 12b, an excessive input signal applied to the gate electrode of the field effect transistor, that is, an overdrive, can again upset the desired reversed-biasing condition at the gate-source junction and result in excessive or damaging currents flowing through the field effect transistor.

In order to prevent the foregoing, the field effect transistor amplifier of FIG. 6 is, according to this invention, provided with a protective circuit by which the maximum drain or source current of each of the depletion-type field effect transistors $F_{1a}$, $F_{2a}$, $F_{1b}$ and $F_{2b}$ in output amplifier stage 13 is maintained below the drain or source current of such transistor in the absence of any gate-source voltage applied thereto, at least for the range of relatively low values of the impedance or resistance of the load $Z_L$. More specifically, as shown, the protective circuit according to this invention comprises source resistors $R_{9a}$, $R_{10a}$, $R_{9b}$ and $R_{10b}$ connected in series with the source electrodes of transistors $F_{1a}$, $F_{2a}$, $F_{1b}$ and $F_{2b}$, respectively, that is, connected between the respective source electrodes and the output terminal $t_3$. The protective circuit further comprises a diode $D_{5a}$ connected between the gate electrodes of transistors $F_{1a}$ and $F_{2a}$ and output terminal $t_3$, that is, the sides of source resistors $R_{9a}$ and $R_{10a}$ remote from the respective source electrodes, and a diode $D_{5b}$ connected between the gate electrodes of transistors $F_{1b}$ and $F_{2b}$ and output terminal $t_3$, that is, the sides of source resistors $R_{9b}$ and $R_{10b}$ remote from the respective source electrodes.

The diodes $D_{5a}$ and $D_{5b}$ are respectively polarized, as shown, to limit the level of the input signals applied to the gate electrodes of the respective transistors $F_{1a}$ and $F_{2a}$, and $F_{1b}$ and $F_{2b}$. Thus so long as the input signal from the output terminal $t_2$ of driving amplifier stage 11 is not excessive and the predetermined DC gate bias voltages are applied to transistors $F_{1a}$, $F_{2a}$, $F_{1b}$ and $F_{2b}$, diodes $D_{5a}$ and $D_{5b}$ are non-conductive. However, in the event that the input signal from driving stage 11 becomes excessive, or in the event that such input signal is applied to transistors $F_{1a}$, $F_{2a}$, $F_{1b}$ and $F_{2b}$ prior to the application of the predetermined DC gate bias voltages thereto, diodes $D_{5a}$ and $D_{5b}$ conduct for limiting the input signals applied to such transistors and thereby preventing damage thereto by overdriving. Further, the source resistors $R_{9a}$ and $R_{10a}$ and the source resistors $R_{9b}$ and $R_{10b}$ cooperate with the diodes $D_{5a}$ and $D_{5b}$, respectively, for limiting the drain currents, and hence the source currents, of the transistors $F_{1a}$ and $F_{2a}$ and of the transistors $F_{1b}$ and $F_{2b}$, respectively. More specifically, the limits on the drain currents are determined by the forward voltages of the diodes $D_{5a}$ and $D_{5b}$ and by the resistance values of the source resistors $R_{9a}$, $R_{10a}$, $R_{9b}$ and $R_{10b}$. The effective forward voltage of the diodes, which function as constant voltage elements, can be increased, for example, doubled, tripled and so on, by similarly increasing the number of diodes connected in parallel with the gate electrode of each of the field effect transistors.

Figure 7:
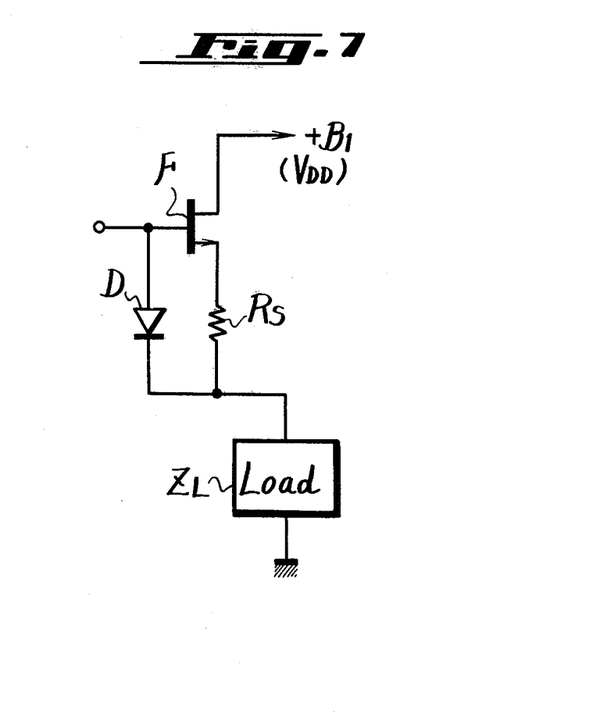
FIG. 7 is a circuit diagram showing a basic unit of an amplifier having a protective circuit according to this invention.

The operation of the above protective circuit for transistors $F_{1a}$, $F_{2a}$, $F_{1b}$ and $F_{2b}$ will now be more specifically described with reference to FIG. 7 which illustrates a basic unit of the protective circuit, that is, the elements thereof for an amplifier employing a single depletion-type field effect transistor F as the amplifying element, which, in this example, is of the N-channel type. Thus, in accordance with this invention, the simplified circuit of FIG. 7 is shown to include a limiting diode D connected in parallel with the gate electrode of transistor F and a resistor $R_s$ connected in series with the source electrode thereof. The connection point between diode D and resistor $R_s$ is grounded through a load or speaker $Z_L$. The drain electrode of transistor F is connected to the voltage source terminal $+B_1$ so that an operating voltage $V_{DD}$ is applied to the drain electrode.

Figure 8:
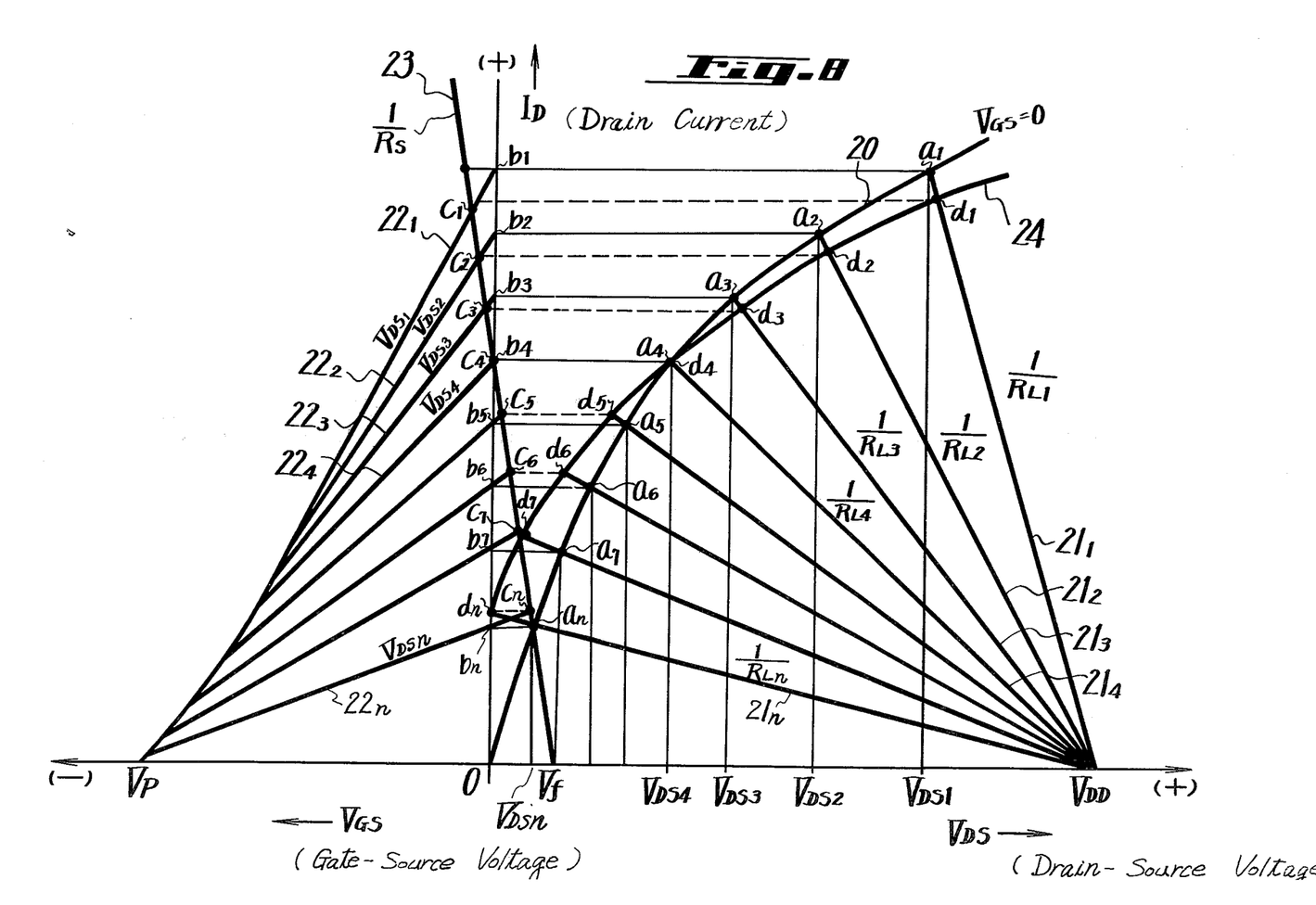
FIG. 8 is a graph to which reference will be made in explaining the present invention.

FIG. 8 shows the static characteristics of the transistor F, with the drain-source voltage $V_{DS}$ and the gate-source voltage $V_{GS}$ being plotted along the abscissa, and the drain current $I_D$ being plotted along the ordinate. Reference numeral 20 indicates the $V_{DS} - I_D$ characteristic curve for $V_{GS}=0$. Since the load resistance $R_L$ of load $Z_L$ varies continuously when the latter is a reactive load, an infinite number of load lines can be drawn. However, for the sake of simplicity, only a finite number of load lines $21_1$, $21_2$, $21_3$, $21_4$ - - - $21_n$ are shown on FIG. 8 and correspond to progressively increasing load resistances $R_{L1}$, $R_{L2}$, $R_{L3}$, $R_{L4}$ - - - $R_{Ln}$, respectively. The points $a_1$, $a_2$, $a_3$, $a_4$ - - - $a_n$ at which the load lines $21_1$, $21_2$, $21_3$, $21_4$ - - - $21_n$ respectively intersect curve 20 correspond to the values $b_1$, $b_2$, $b_3$, $b_4$ - - - $b_n$ of the drain current $I_D$ for the respective load resistances when the gate-source voltage $V_{GS}=0$, that is when neither a DC gate bias voltage nor an input signal is applied to the gate electrode of transistor F. Further, the points $a_1$, $a_2$, $a_3$, $a_4$ - - - $a_n$ respectively correspond to drain-source voltages $V_{DS1}$, $V_{DS2}$, $V_{DS3}$, $V_{DS4}$ - - - $V_{DSn}$. If the points $b_1$, $b_2$, $b_3$, $b_4$ - - - $b_n$ on the ordinate are connected to the pinch-off voltage $V_p$ of the field effect transistor, which, as shown, is a negative voltage in the case of the transistor F being of the N-channel type, there are obtained $V_{GS}-I_D$ characteristic curves $22_1$, $22_2$, $22_3$, $22_4$ - - - $22_n$ which respectively correspond to the drain-source voltages $V_{DS1}$, $V_{DS2}$, $V_{DS3}$, $V_{DS4}$ - - - $V_{DSn}$.

In the simplified circuit of FIG. 7, if the forward voltage of diode D is represented by $V_f$ and the resistance value of source resistor $R_s$ is represented by $r_s$, the gate-source voltage $V_{GS}$ of transistor F and the drain current $I_D$ thereof will have the following relationship:

$$V_f = V_{GS} + I_D \cdot r_s$$

or $$V_{GS} = V_f - I_D \cdot r_s \qquad (5)$$

The relationship of equation (5) is represented by the straight line 23 on FIG. 8. The intersections $C_1$, $C_2$, $C_3$, $C_4$ - - - $C_n$ of $V_{GS}-I_D$ curves $22_1$, $22_2$, $22_3$, $22_4$ - - - $22_n$, respectively, with line 23 represent the maximum drain currents of the transistor F in the circuit of FIG. 7 for the various drain-source voltage values $V_{DS1}$, $V_{DS2}$, $V_{DS3}$, $V_{DS4}$ - - - $V_{DSn}$. If these values $C_1$, $C_2$, $C_3$, $C_4$ - - - $C_n$ of drain current are projected onto the load lines $21_1$, $21_2$, $21_3$, $21_4$ - - - $21_n$, respectively, which correspond to the respective drain-source voltages, the respective points of intersection $d_1$, $d_2$, $d_3$, $d_4$ - - - $d_n$ define a limit curve 24. Such limit curve 24 is shown to intersect the $V_{DS}-I_D$ curve 20 at the point $a_4-d_4$ which corresponds to the value of the drain current $I_D$ at which the line 23 intersects the ordinate $I_D$. Of course, line 23 intersects the ordinate $I_D$ at the value of $V_{GS}=0$ which represents the absence of any gate source voltage applied to transistor F, and which when substituted in equation (5), results in:

$$I_D = V_f/r_s \qquad (6)$$

Therefore the value of $I_D$ at which line 23 intersects the ordinate, and hence also the value of the drain current at which the characteristic curve 20 and the limit curve 24 intersect, can be selected or determined by suitably selecting the forward voltage $V_f$ of diode D and the resistance value $r_s$ of source resistor $R_s$.

It will be apparent that, for all values of the load resistance lower than $R_{L4}$, that is, lower than the load resistance which corresponds to the point $a_4$–$d_4$ at which curves 20 and 24 intersect, the limited value of the drain current is less than the respective value of the drain current for the condition where $V_{GS}=0$, that is, in the absence of any gate-source voltage. Of course, the danger to the field effect transistor F from an excessive drain current exists primarily for relatively low values of load resistance, as is apparent from FIG. 8. The range of variation of the load resistance over which the drain current is suppressed to be less than the drain current for the condition of $V_{GS}=0$, that is, the range of variation of the load resistance over which the limit curve 24 lies below the characteristic curve 20 for $V_{GS}=0$, can be obviously determined by suitably selecting the values of $V_f$ and $r_s$ in equation (6). More specifically, by increasing the resistance value $r_s$ of source resistor $R_s$, the drain current $I_D$ at which line 23 intersects the ordinate ($V_{GS}=0$) is reduced with the result that limit curve 24 intersects characteristic curve 20 for $V_{GS}=0$ at a relatively higher value of load resistance.

It will be noted that, during normal operation of the simplified amplifier shown on FIG. 7, that is, when the predetermined DC gate bias voltage is applied across the gate and source electrodes of field effect transistor F and the input signal applied to the gate electrode is not above a predetermined level, the diode D does not conduct, that is, the voltage applied to diode D in its conducting direction does not equal or exceed the forware voltage $V_f$ of the diode. However, when the input signal applied to the gate electrode abruptly exceeds such predetermined level, or when an input signal below that predetermined level is applied to the gate electrode at a time when the full DC gate bias voltage is not applied to the transistor F, the diode D conducts to limit the voltage applied to the gate electrode. Further, as previously described, the diode D and source resistor $R_s$ cooperate to limit the drain currents of transistor F over a substantial range of variation of the load resistance when the foregoing abnormal operating conditions are encountered. Thus, the depletion-type field effect transistor F is protected from damage or destruction by excessive currents that would otherwise flow therein in response to an excessive input signal applied to its gate electrode.

The above description as to the operation of diode D and source resistor $R_s$ in protecting transistor F in the simplified circuit of FIG. 7 is obviously applicable to the operation of diode $D_{5a}$ and resistors $R_{9a}$ and $R_{10a}$, and of diode $D_{5b}$ and resistors $R_{9b}$ and $R_{10b}$ in protecting transistors $F_{1a}$ and $F_{2a}$ and transistors $F_{1b}$ and $F_{2b}$, respectively, in the amplifier of FIG. 6.

The above described protective circuit according to this invention is preferably embodied in a field effect transistor amplifier which, as shown on FIG. 6, is further provided with a detecting circuit 14 which functions to detect the current and voltage of load $Z_L$, that is, the load impedance, and a switching or shunting circuit 15 which is normally opened or non-conductive, but which is closed or rendered conductive by detecting circuit 14 when the latter detects a predetermined reduction of the load impedance, for example, to about 1 ohm or less, so as to protect the triode characteristic field effect transistors $F_{1a}$, $F_{2a}$, $F_{1b}$ and $F_{2b}$ of output stage 13 from damage due to overloading thereof.

The switching or shunting circuit 15 is shown to consist simply of a PNP-type switching transistor $Q_{3a}$ and an NPN-type switching transistor $Q_{3b}$. The emitter electrodes of transistors $Q_{3a}$ and $Q_{3b}$ are connected to output terminal $t_2$ of the driving stage or amplifier 11 through diodes $D_{2a}$ and $D_{2b}$, respectively, which are used for preventing Zener breakdown of the respective transistors $Q_{3a}$ and $Q_{3b}$, and the collector electrodes of the latter are respectively connected to the output terminal $t_3$ of output stage 13. So long as the impedance of load $Z_L$, as detected by circuit 14, is above a predetermined value, transistors $Q_{3a}$ and $Q_{3b}$ are turned OFF or non-conductive, with the result that the signal at output terminal $t_2$ of driving stage amplifier 11 is normally applied, as the input, to triode characteristic field effect transistors $F_{1a}$, $F_{2a}$, $F_{1b}$ and $F_{2b}$ of output stage amplifier 13 for further amplifying thereby prior to being applied to output terminal $t_3$. However, when the detected load impedance falls below such predetermined value, circuit 14 causes transistors $Q_{3a}$ and $Q_{3b}$ to be turned ON or rendered conductive, as hereinafter described, with the result that switching circuit 15 is closed for shunting the signal from output terminal $t_2$ of driving stage 11 to output terminal $t_3$ of output stage 13.

The detecting circuit 14 is shown to be generally composed of a first detecting circuit 14a for detecting the current of load $Z_L$ as the drain currents of transistors $F_{1a}$ and $F_{2a}$ and a second detecting circuit 14b for detecting the current of load $Z_L$ as the drain currents of transistors $F_{1b}$ and $F_{2b}$.

In the first detecting circuit 14a, an NPN-type controlling transistor $Q_{4a}$ has its collector electrode connected to the base electrode of transistor $Q_{3a}$ in switching circuit 15 and the emitter electrode of transistor $Q_{4a}$ is connected to output terminal $t_3$. A capacitor $C_{3a}$ is connected between the base electrode of transistor $Q_{4a}$ and output terminal $t_3$. The source electrodes of transistors $F_{1a}$ and $F_{2a}$ are connected to the anodes of rectifying diodes $D_{4a}$ and $D'_{4a}$, respectively, while the cathodes of such diodes are connected through a resistor $R_{8a}$ to the base electrode of transistor $Q_{4a}$. Further, the base electrode of transistor $Q_{4a}$ is connected to the anode of a rectifying diode $D_{3a}$ while the cathode of the latter is grounded through a resistor $R_{7a}$.

In the second detecting circuit 14b, a PNP-type controlling transistor $Q_{4b}$ has its collector electrode connected to the base electrode of transistor $Q_{3b}$ in switching circuit 15 and the emitter electrode of transistor $Q_{4b}$ is connected to output terminal $t_3$. A capacitor $C_{3b}$ is connected between the base electrode of transistor $Q_{4b}$ and output terminal $t_3$. The source electrodes of transistors $F_{1b}$ and $F_{2b}$ are connected to the cathodes of rectifying diodes $D_{4b}$ and $D'_{4b}$, respectively, while the anodes of the latter are connected through a resistor $R_{8b}$ to the base electrode of transistor $Q_{4b}$. Further, the base electrode of transistor $Q_{4b}$ is connected to the cathode of a rectifying diode $D_{3b}$ while the anode of the latter is grounded through a resistor $R_{7b}$.

The first and second detecting circuits 14a and 14b and the transistors $Q_{3a}$ and $Q_{3b}$ of switching circuit 15 are symmetrical with respect to output terminal $t_3$ of output stage amplifier 13 and operate similarly so that only the operation of detecting circuit 14a will be described in detail.

When transistors $F_{1a}$ and $F_{2a}$ are supplied with the half cycle component of a signal appearing at output terminal $t_2$ of the driving stage amplifier 11, resistors $R_{9a}$ and $R_{10a}$ are adapted to detect the current through load $Z_L$. That is, the voltages across resistors $R_{9a}$ and $R_{10a}$ are rectified by diodes $D_{4a}$ and $D'_{4a}$, respectively, and supplied to one end of capacitor $C_{3a}$ (at the base electrode side of the transistor $Q_{4a}$), and the voltage across load $Z_L$ is supplied to the other end of capacitor $C_{3a}$ (at the emitter electrode side of the transistor $Q_{4a}$) by a closed loop constituted by resistor $R_{7a}$, diode $D_{3a}$, capacitor $C_{3a}$ and load $Z_L$.

When the impedance of load $Z_L$ has a normal value, the voltage across the load $Z_L$ is higher than the ground potential, and hence the emitter potential of transistor $Q_{4a}$ is also high. In addition, amplified output signals are obtained at the source electrodes of transistors $F_{1a}$ and $F_{2a}$ and the capacitor $C_{3a}$ is temporarily charged by these amplified signals. However, such electric charge is immediately discharged through diode $D_{3a}$ and resistor $R_{7a}$ and, thereafter, the above charging and discharging operation is repeated. As a result, the voltage required for turning ON transistor $Q_{4b}$ does not appear between the base and emitter electrodes of transistor $Q_{4a}$. Accordingly, transistor $Q_{3a}$ of switching circuit 15 is kept in its OFF state and, hence, transistors $F_{1a}$ and $F_{2a}$ perform their normal amplifying functions.

When the impedance of load $Z_L$ is lowered to a predetermined value, for example, 1 ohm or less, due to a short-circuit or the like, the voltage across the load is also lowered and hence the emitter potential of transistor $Q_{4a}$ is extremely lowered. Further, such lowering of the impedance of load $Z_L$ causes a large DC current to flow through load $Z_L$, so that the voltages across resistors $R_{9a}$ and $R_{10a}$ increase correspondingly, and thus capacitor $C_{3a}$ is charged with increased voltages through diodes $D_{4a}$ and $D'_{4a}$ and the increased charge on capacitor $C_{3a}$, being due to a DC current, is not discharged through diode $D_{3a}$ and resistor $R_{7a}$. For this reason, the base potential of transistor $Q_{4a}$ is also increased to turn ON transistor $Q_{4a}$, so that transistor $Q_{3a}$ is also turned ON to supply the signal from the output terminal $t_2$ of the driving stage amplifier 11 directly to output terminal $t_3$ of the output stage amplifier 13 through diode $D_{2a}$ and transistor $Q_{3a}$. As a result, the gate-source voltage of each transistor $F_{1a}$ and $F_{2a}$ is fixed at the biasing voltage (a voltage similar to the pinch-off voltage) which is equivalent to removing the signal at the output terminal $t_2$ of driving stage amplifier 11 from transistors $F_{1a}$ and $F_{2a}$ of output stage amplifier 13.

Therefore, the drain currents of transistors $F_{1a}$ and $F_{2a}$ are immediately suppressed to a minimum value determined by the predetermined DC gate bias voltage thereof to prevent these transistors $F_{1a}$ and $F_{2a}$ from being damaged due to the increase of the load currents, that is, the drain losses. In other words, in detecting circuit 14a, transistor $Q_{3a}$ is adapted to be turned ON when the load current is increased to enhance the base potential of the transistor $Q_{4a}$, or when the voltage across the load $Z_L$ is decreased to lower the emitter potential of transistor $Q_{4a}$, that is, when the load impedance is lowered to a predetermined value or less.

As previously indicated, detecting circuit 14b operates similarly to detecting circuit 14a for preventing damage to transistors $F_{1b}$ and $F_{2b}$ when the load impedance or current is seriously altered, as by a short circuit.

It will be apparent that the resistors $R_{9a}$, $R_{10a}$, $R_{9b}$ and $R_{10b}$ in the field effect transistor of FIG. 6 perform dual functions, to wit, such resistors are included in the protective circuit by which the amplifying field effect transistors are protected from damage by excessive input signals and also in the protective circuit by which those transistors are protected from damage by extremely low values of load impedance, for example, as caused by a short circuit in the load.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A field effect transistor amplifier comprising: a voltage source for supplying an operating voltage; at least a first depletion-type field effect transistor having gate, source and drain electrodes; means for applying said operating voltage across said drain and source electrodes through a load; input circuit means for applying an input signal to be amplified to said gate electrode of the field effect transistor; biasing circuit means for applying a predetermined DC gate bias voltage between said gate and source electrodes; protective circuit means for preventing damage to said field effect transistor by an excessive input signal including a source resistor connected in series with said source electrode, and constant voltage means connected between said gate electrode and the side of said source resistor remote from said source electrode, the resistance value of said source resistor and the voltage value of said constant voltage means being selected so that the maximum drain-source current of said field effect transistor, when operated with an input signal applied to its gate electrode, does not exceed the maximum drain-source current of said field effect transistor in the absence of any gate-source voltage applied thereto, shunting means operative to shunt said input signal directly to said load while said field effect transistor continues to have said predetermined DC gate bias voltage applied thereto; and detecting means for detecting an overload condition of said field effect transistor including a capacitor, a first rectifying circuit means having a diode and a resistor connected between said source resistor and said capacitor for applying to the latter a first DC voltage of one polarity which is proportional to the voltage across said source resistor, a second rectifying circuit means having a diode and a resistor connected between said capacitor and the load for applying to said capacitor a second DC voltage of the opposite polarity which is proportional to the voltage across said load so that the DC voltage across said capacitor is proportional to the impedance of said load, and means responsive to said DC voltage across the capacitor for operating said shunting means when said DC voltage across the capacitor is indicative of a predetermined low value of the load impedance.

2. A field effect transistor amplifier according to claim 1; in which said means responsive to the DC voltage across said capacitor includes a switching transistor having first, second and third electrodes, and said first and second electrodes are connected across said capacitor to provide a control signal at said third electrode for operating said shunting means when said DC voltage across said capacitor exceeds a predetermined value.

3. A field effect transistor amplifier according to claim 2; in which said shunting means includes a shunting transistor having a normally non-conductive output circuit connected between said input circuit means and said load, and a control electrode connected with said third electrode of the switching transistor for making said output circuit conductive in response to said control signal.

4. A field effect transistor amplifier according to claim 1; in which said field effect transistor has triode characteristics, and said biasing circuit means includes compensating means for varying said gate bias voltage in response to voltage fluctuations in said operating voltage so as to stabilize the biasing DC drain current of the triode characteristic field effect transistor.

5. A field effect transistor amplifier according to claim 1; in which said constant voltage means is constituted by at least one diode.

6. A field effect transistor amplifier comprising; a voltage source for supplying an operating voltage; first and second depletion-type field effect transistors each having gate, source and drain electrodes; means for applying said operating voltage across said drain and source electrodes of each of said first and second transistors through a load; input circuit means for applying an input signal to be amplified to said gate electrode of each of the field effect transistors so as to drive said first and second field effect transistors with a push-pull relationship therebetween; biasing circuit means for applying first and second predetermined DC gate bias voltages between the gate and source electrodes of said first and second field effect transistors, respectively; protective circuit means for preventing damage to said field effect transistor by an excessive input signal including first and second source resistors connected in series with the source electrodes of said first and second field effect transistors, respectively, first constant voltage means connected between the gate electrode of said first field effect transistor and the side of said first source resistor remote from the respective source electrode, and second constant voltage means connected between the gate electrode of said second field effect transistor and the side of said second source resistor remote from the respective source electrode, the resistance values of said first and second source resistors and the voltage values of said first and second constant voltage means being selected so that the maximum drain source current of each of said first and second field effect transistors, when operated with an input signal applied to its gate electrode, does not exceed the maximum drain-source current of the respective field effect transistor in the absence of any gate-source voltage applied thereto; shunting means operative to shunt said input signal directly to said load while said first and second DC gate bias voltages continue to be applied to said first and second field effect transistors; and detecting means for detecting an overload condition of each of said first and second field effect transistors including, for each of said first and second field effect transistors, a capacitor, a first rectifying circuit means having a diode and a resistor connected between the respective source resistor and said capacitor for applying to the latter a DC voltage of one polarity which is proportional to the voltage across said respective source resistor, a second rectifying circuit means having a diode and a resistor connected between said capacitor and said load for applying to said capacitor a DC voltage of the opposite polarity which is proportional to the voltage across said load so that the DC voltage across said capacitor is proportional to the impedance of said load, and means responsive to said DC voltage across the capacitor for operating said shunting means when said DC voltage across the capacitor is indicative of a predetermined low value of the load impedance.

7. A field effect transistor amplifier according to claim 6; in which said means responsive to the DC voltage across said capacitor includes a switching transistor having first, second and third electrodes, and said first and second electrodes are connected across said capacitor to provide a control signal at said third electrode for operating said shunting means when said DC voltage across said capacitor exceeds a predetermined value.

8. A field effect transistor amplifier according to claim 7; in which said shunting means includes a shunting transistor having a normally non-conductive output circuit connected between said input circuit means and said load, and a control electrode connected with said third electrode of the switching transistor for making said output circuit conductive in response to said control signal.

9. A field effect transistor amplifier according to claim 6; in which said first and second field effect transistors have triode characteristics, and said biasing circuit means includes compensating means for varying each said DC gate bias voltage in response to voltage fluctuations in said operating voltage so as to stabilize the biasing DC drain current of each of the triode characteristic field effect transistors.

10. A field effect transistor amplifier according to claim 6; in which each of said first and second constant voltage means is constituted by at least one diode.

* * * * *